US012772500B2

(12) United States Patent
Lim et al.

(10) Patent No.: US 12,772,500 B2
(45) Date of Patent: Oct. 20, 2026

(54) BOTTOM CHANNEL TRENCH ISOLATED GATE ALL AROUND (GAA) FIELD EFFECT TRANSISTOR (FET)

(71) Applicant: QUALCOMM Incorporated, San Diego, CA (US)

(72) Inventors: Kwanyong Lim, San Diego, CA (US); Hyunwoo Park, San Diego, CA (US); Junjing Bao, San Diego, CA (US); Chih-Sung Yang, Hsinchu City (TW); Ming-Huei Lin, New Taipei City (TW); Haining Yang, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 358 days.

(21) Appl. No.: 18/493,634

(22) Filed: Oct. 24, 2023

(65) Prior Publication Data

US 2025/0133772 A1 Apr. 24, 2025

(51) Int. Cl.

*H10D 30/67* (2025.01)
*H10D 30/01* (2025.01)
*H10D 30/43* (2025.01)
*H10D 62/10* (2025.01)
*H10D 62/13* (2025.01)

(Continued)

(52) U.S. Cl.

CPC ....... *H10D 30/6735* (2025.01); *H10D 30/014* (2025.01); *H10D 30/43* (2025.01); *H10D 30/6757* (2025.01); *H10D 62/121* (2025.01); *H10D 62/151* (2025.01); *H10D 64/017* (2025.01); *H10D 64/021* (2025.01);

(Continued)

(58) Field of Classification Search

CPC .. H10D 30/6735; H10D 30/014; H10D 30/43; H10D 30/6757; H10D 62/121; H10D 62/151; H10D 64/017; H10D 64/021; H10D 84/0167; H10D 84/017; H10D 84/038; H10D 84/85; H10D 62/115; H10D 62/116; H10D 62/364

See application file for complete search history.

(56) References Cited

U.S. PATENT DOCUMENTS

2022/0045052 A1* 2/2022 Huang .................. H10D 30/43
2023/0209798 A1* 6/2023 Ong .................. H10D 84/8311 257/369
2023/0282751 A1* 9/2023 Chen .................. H10D 64/518 257/347

FOREIGN PATENT DOCUMENTS

CN 115985940 A 4/2023

OTHER PUBLICATIONS

International Search Report and Written Opinion—PCT/US2024/046353—ISA/EPO—Dec. 5, 2024.

* cited by examiner

*Primary Examiner* — Thanh T Nguyen
(74) *Attorney, Agent, or Firm* — Seyfarth Shaw LLP

(57) ABSTRACT

A gate all around (GAA) field effect transistor (GAA FET) is described. The GAA FET includes a substrate, having a nanosheet structure on the substrate. The GAA FET also includes a source/drain (SD) region in the substrate and coupled to a first end of the nanosheet structure. The GAA FET further includes a drain/source (DS) region in the substrate and coupled to a second end opposite the first end of the nanosheet structure. The GAA FET also includes a metal gate on the nanosheet structure to define channels between the source/drain region and the drain/source region. The GAA FET further includes a trench oxide blocking a bottom channel of the channels.

9 Claims, 10 Drawing Sheets

(51) Int. Cl.

| | |
|---|---|
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ....... *H10D 84/0167* (2025.01); *H10D 84/017* (2025.01); *H10D 84/038* (2025.01); *H10D 84/85* (2025.01)

BOTTOM CHANNEL TRENCH ISOLATED GATE ALL AROUND (GAA) FIELD EFFECT TRANSISTOR (FET)

BACKGROUND

Field

Aspects of the present disclosure relate to semiconductor devices and, more particularly, to a bottom channel trench isolated gate all around (GAA) field effect transistor (FET) (GAA FET).

Background

As integrated circuit (IC) technology advances, device geometries are reduced. Technological advances in IC materials and design have produced generations of ICs in which each generation has smaller and more complex circuits than the previous generation. In the course of IC evolution, functional density has increased while geometry size has decreased. This scaling down process provides benefits by increasing production efficiency and lowering associated costs. Such scaling down also increases the complexity of processing and manufacturing ICs. Moreover, realizing these advancements involve similar developments in IC processing and manufacturing.

Although existing methods of fabricating IC devices are adequate for their intended purposes, they are not entirely satisfactory in all respects. For example, fin-based devices are three-dimensional structures on the surface of a semiconductor substrate. A fin-based field effect transistor (FET) may be referred to as a FinFET. One advancement implemented as technology nodes shrink, in some IC designs, is the replacement of the polysilicon gate electrode with a metal gate electrode to improve device performance with the decreased feature sizes.

Advanced logic complementary metal oxide semiconductor (CMOS) scaling for FinFET technologies, such as gate all around (GAA) FETs achieves a performance-power-area (PPA) boost over past process nodes. Unfortunately, further FinFET transistor mobility in smaller process nodes is difficult due to channel induced subthreshold leakage, which causes source/drain-to-substrate junction leakage. Therefore, a trench isolation technique for reducing channel induced subthreshold leakage is desired.

SUMMARY

A gate all around (GAA) field effect transistor (GAA FET) is described. The GAA FET includes a substrate, having a nanosheet structure on the substrate. The GAA FET also includes a source/drain (SD) region in the substrate and coupled to a first end of the nanosheet structure. The GAA FET further includes a drain/source (DS) region in the substrate and coupled to a second end opposite the first end of the nanosheet structure. The GAA FET also includes a metal gate on the nanosheet structure to define channels between the source/drain region and the drain/source region. The GAA FET further includes a trench oxide blocking a bottom channel of the channels.

A method for fabricating a gate all around (GAA) field effect transistor (FET) (GAA FET) is described. The method includes forming a nanosheet structure on a substrate. The method also includes forming a source/drain (SD) region in the substrate and coupled to a first end of the nanosheet structure. The method further includes forming a drain/source (DS) region in the substrate and coupled to a second end opposite the first end of the nanosheet structure. The method also includes forming a metal gate on the nanosheet structure to define a plurality of channels between the SD region and the DS region. The method further includes forming a trench oxide to contact the gate and block a bottom channel of the plurality of channels.

This has outlined, broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for conducting the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
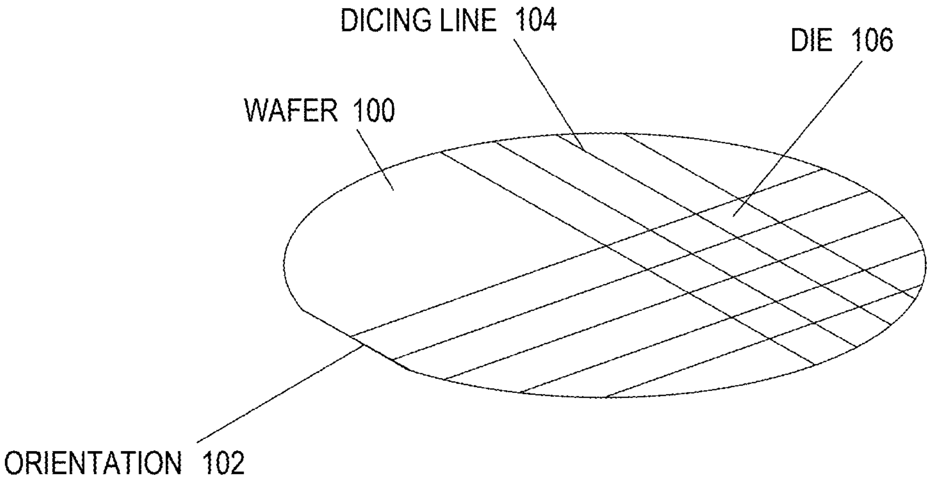
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

As integrated circuit (IC) technology advances, device geometries are reduced. Technological advances in IC materials and design have produced generations of ICs in which each generation has smaller and more complex circuits than the previous generation. In the course of IC evolution, functional density has increased while geometry size has decreased. This scaling down process provides benefits by increasing production efficiency and lowering associated costs. Such scaling down has also increased the complexity of processing and manufacturing ICs. Realizing these advancements involves similar developments in IC processing and manufacturing.

Fin-based devices represent a significant advance in IC technology over planar-based devices. Fin-based devices are three-dimensional structures on the surface of a semiconductor substrate. A fin-based field effect transistor (FinFET) is a fin-based metal oxide semiconductor field effect transistor (MOSFET). A nanowire FET also represents a significant advancement in IC technology. A gate all around (GAA) nanosheet-based device is another three-dimensional structure on the surface of a semiconductor substrate. Other fin-based devices include omega-gate devices as well as pi-gate devices. A vertical structure-based FET may be referred to as a FinFET device, a GAA nanosheet-based device, a GAA nanowire-based device, or other like FET device.

Advanced logic complementary metal oxide semiconductor (CMOS) scaling for FinFET technologies, such as GAA FETs, achieves a performance-power-area (PPA) boost over past process nodes. Unfortunately, further FinFET transistor mobility in smaller process nodes is difficult due to channel induced subthreshold leakage, which causes source/drain-to-substrate junction leakage. Therefore, a trench isolation technique for reducing channel induced subthreshold leakage is desired.

Various aspects of the present disclosure are directed to a bottom channel trench isolated gate all around (GAA) field effect transistor (GAA FET). The process flow for fabricating the bottom channel trench isolated GAA FET may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms "wafer" and "die" may be used interchangeably unless such interchanging would tax credulity.

According to aspects of the present disclosure, a bottom channel trench isolated GAA FET includes a substrate having a nanosheet structure on the substrate. The GAA FET also includes a source/drain (SD) region in the substrate and coupled to a first end of the nanosheet structure. The GAA FET further includes a drain/source (DS) region in the substrate and coupled to a second end opposite the first end of the nanosheet structure. The GAA FET also includes a metal gate on the nanosheet structure to define channels between the SD region and the DS region. In various aspects of the present disclosure, the GAA FET includes a trench oxide to separate a bottom channel of the plurality of channels.

FIG. 1 illustrates a perspective view of a semiconductor wafer, which may be used for fabricating a bottom channel trench isolated gate all around (GAA) field effect transistor (FET) (GAA FET), according to various aspects of the present disclosure. A wafer 100 may be a semiconductor wafer or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a single material (e.g., silicon (Si), germanium (Ge)) or a compound material, such as gallium arsenide (GaAs), gallium nitride (GaN), or indium phosphide (InP), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, diverse types of electronic devices may be formed in or on the wafer 100.

The wafer 100 has an orientation 102 that indicates the crystalline orientation of the wafer 100. The orientation 102 may be a flat edge of the wafer 100 as shown in FIG. 1 or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) on the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
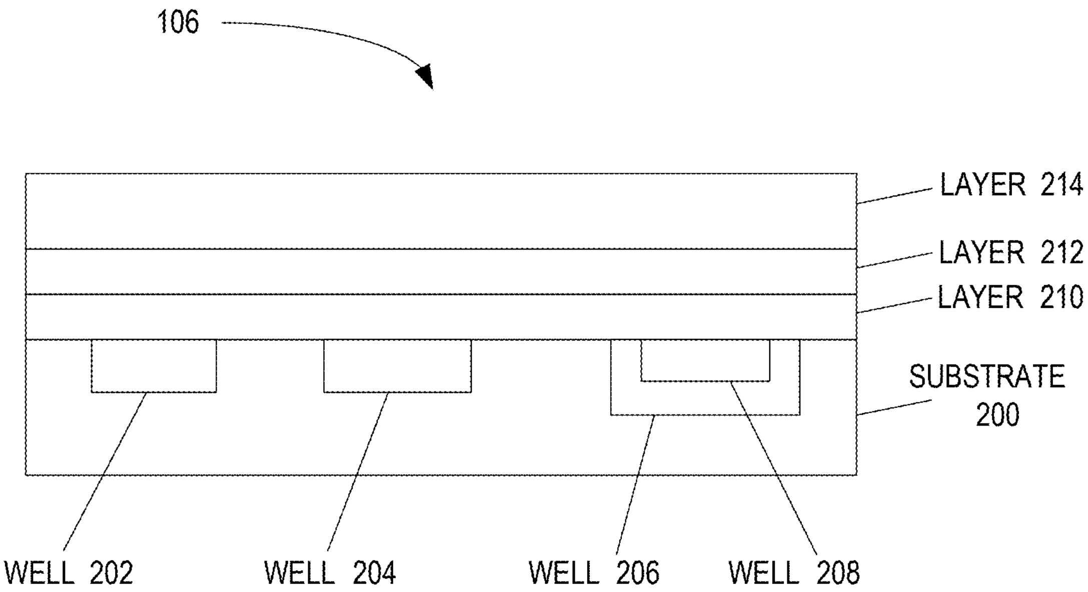
FIG. 2 illustrates a cross-sectional view of the die of FIG. 1.

FIG. 2 illustrates a cross-sectional view of the die 106 of FIG. 1, which may be used for fabricating a bottom channel trench isolated gate all around (GAA) field effect transistor (FET) (GAA FET), according to various aspects of the present disclosure. In the die 106, there may be a substrate 200, which may be a semiconductor material and/or may function as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within the substrate 200 (e.g., a semiconductor substrate), there may be wells 202 and 204 of a field effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
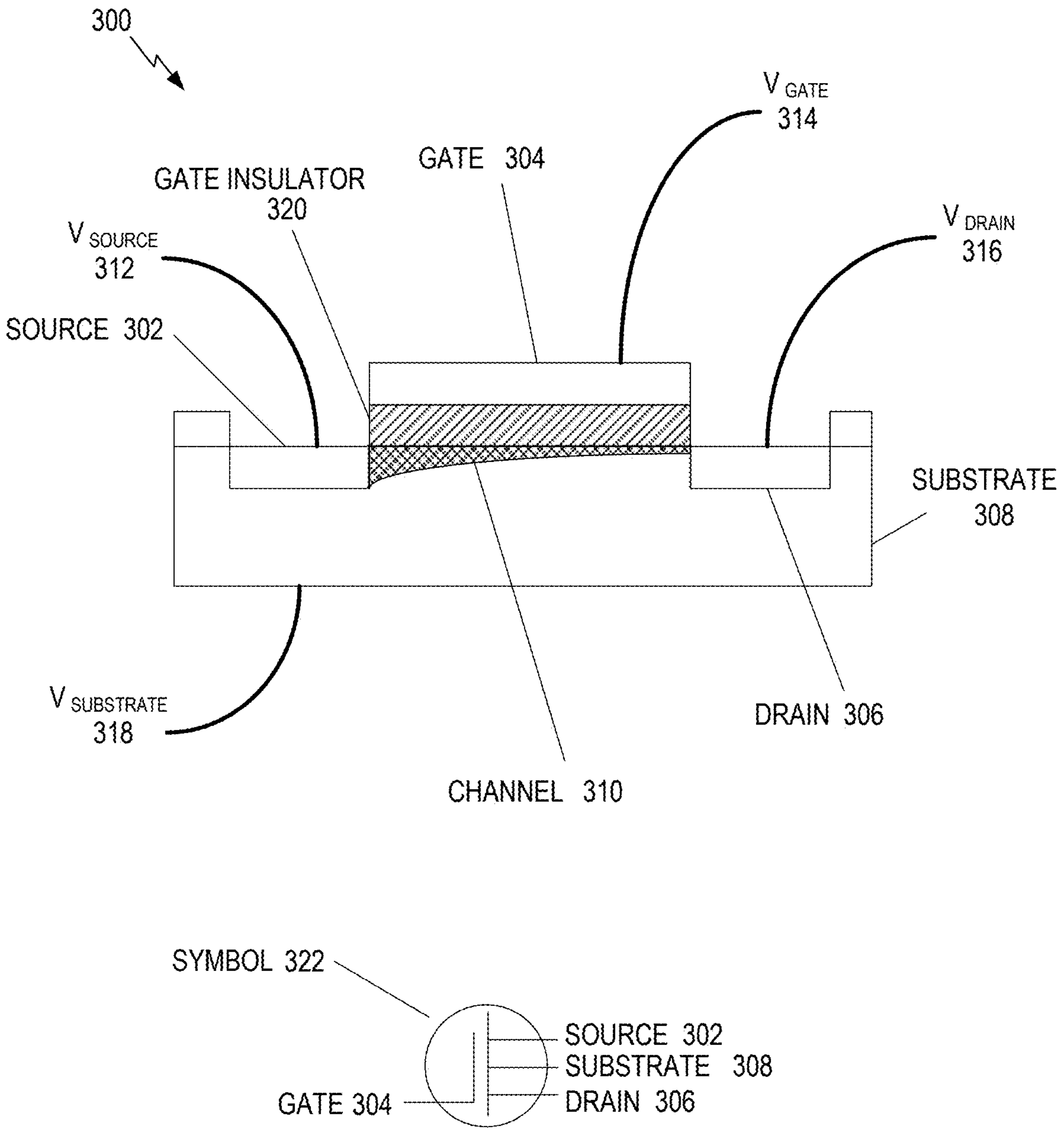
FIG. 3 illustrates a cross-sectional view of a metal oxide semiconductor field effect transistor (MOSFET) device.

FIG. 3 illustrates a cross-sectional view of a metal oxide semiconductor field effect transistor (MOSFET) device 300. The MOSFET device 300 may have four input terminals. The four inputs are a source 302, a gate 304, a drain 306, and a body. The source 302 and the drain 306 may be fabricated as the wells 202 and 204 in a substrate 308 or may be fabricated as areas above the substrate 308, or as part of other layers on the die 106. Such other structures may be a fin or other structure that protrudes from a surface of the substrate 308. Further, the substrate 308 may be the substrate 200 on the die 106, but the substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314, or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For P-type MOSFETs (using holes as charge carriers in the channel 310), an arrow is applied to the substrate 308 terminal in the symbol 322 pointing toward the gate 304 terminal.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304, as described below.

To interconnect to the MOSFET device 300, or to interconnect to other devices in the die 106 (e.g., semiconductor), interconnect traces or layers are used. These interconnect traces may be in one or more layers (e.g., 210-214), or may be in other layers of the die 106.

Figure 4:
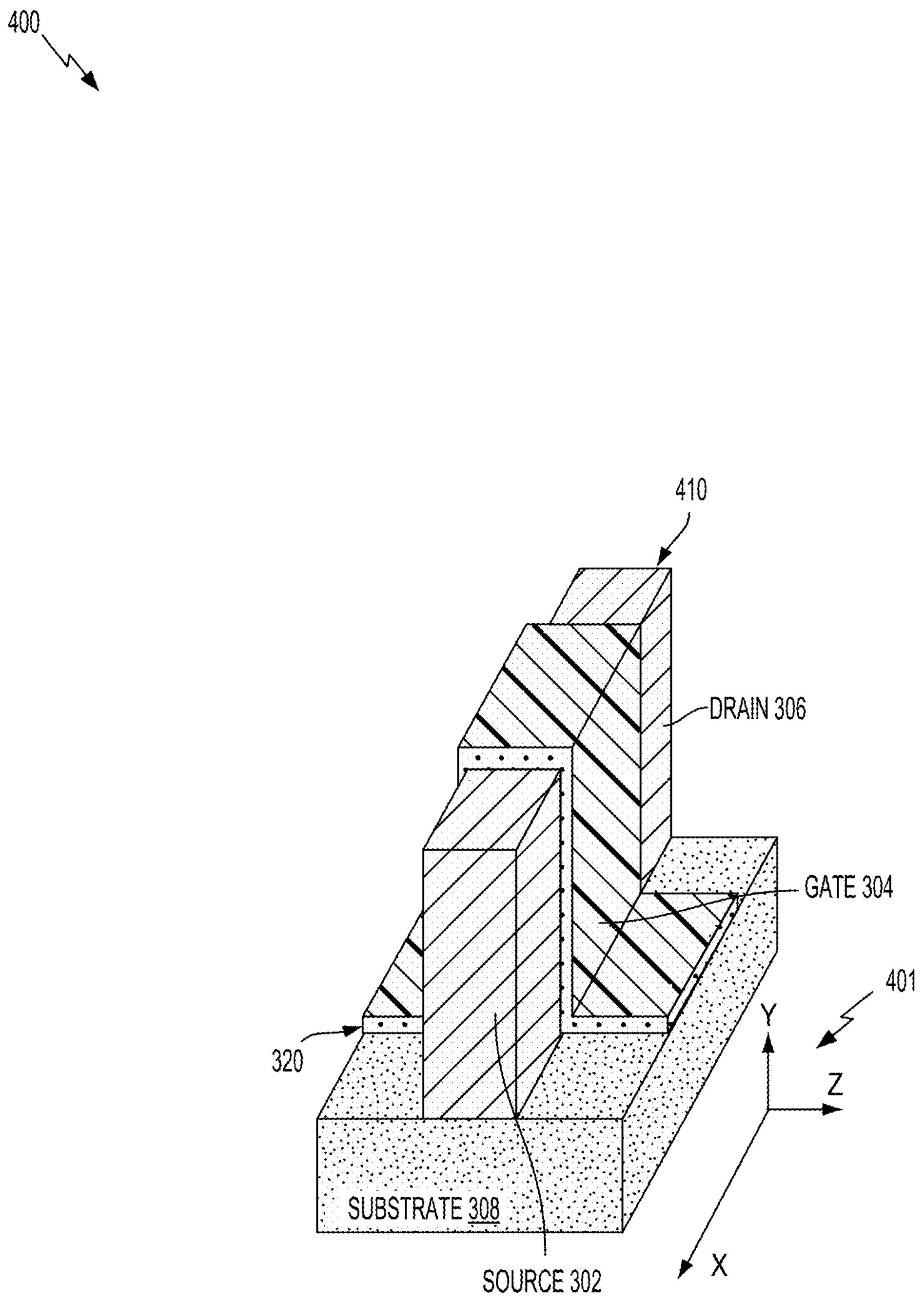
FIG. 4 illustrates a fin-based field effect transistor (FinFET), having a low-k oxide in a gate region, according to various aspects of the present disclosure.

FIG. 4 illustrates a fin-based field effect transistor (FinFET), having a low-k oxide in a gate region, according to various aspects of the present disclosure. As shown in FIG. 4, a FinFET 400 operates in a similar fashion to the MOSFET device 300 described with respect to FIG. 3. A fin 410 of the FinFET 400, however, is grown or otherwise coupled to the substrate 308 of FIG. 3. The substrate 308 may be a semiconductor substrate or other like supporting layer, for example, comprised of an oxide layer, a nitride layer, a metal oxide layer, or a silicon layer. The fin 410 includes the source 302 and the drain 306. A gate 304 is disposed on the fin 410 and on the substrate 308 through a gate insulator 320. An XYZ axis 401 of the FinFET 400 is also shown.

Figure 5:
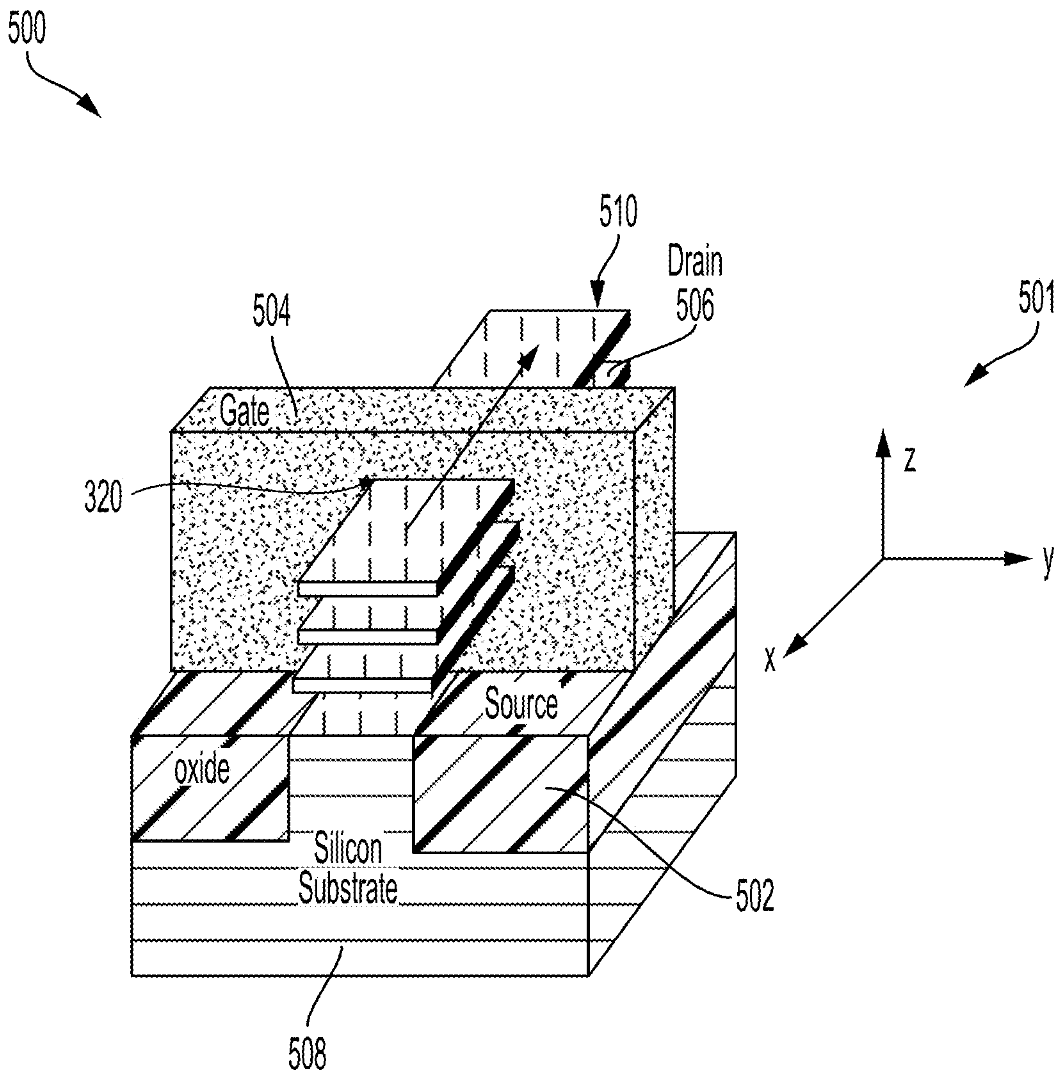
FIG. 5 illustrates a gate all around (GAA) field effect transistor (FET) (GAA FET), having a low-k oxide in a gate region, according to various aspects of the present disclosure.

FIG. 5 illustrates a gate all around (GAA) field effect transistor (FET) (GAA FET), having a low-k oxide in a gate region, according to aspects of the present disclosure. As shown in FIG. 5, a nanosheet 510 of the GAA FET 500 is grown or otherwise coupled to a substrate 508. The substrate 508 may be a semiconductor substrate or other like supporting layer, for example, comprised of an oxide layer, a nitride layer, a metal oxide layer, or a silicon layer. The nanosheet 510 also includes a source 502 and a drain 506. Additionally, a gate 504 is disposed on and surrounds the nanosheet 460 on four sides through a gate insulator 320 to provide first and second channels. The gate 504 is also on the substrate 508. An XYZ axis 501 of the GAA FET 500 is also shown. As illustrated by the XYZ axis 501, the Y and Z axis are swapped in the configuration of the GAA FET 500 relative to the XYZ axis 401 of the FinFET 400 in FIG. 4.

FIGS. 4 and 5 illustrate vertical structure-based field effect transistors (FETs). The vertical structure of the FinFET 400 and the GAA FET 500 facilitates a physical size of the FinFET 400 and the GAA FET 500 that is smaller than the MOSFET device 300 structure shown in FIG. 3. This reduction in the physical size allows for more devices per unit area on the die 106 shown in FIG. 1. The FinFET 400 and the GAA FET 500 may be fabricated through processes including a front-end-of-line (FEOL), a middle-of-line (MOL) and a back-end-of-line (BEOL). An MOL process includes gate and terminal contact formation, which may be referred to as a zero interconnect (MO) layer. An MOL layer trench contacts the source and drain regions of the FinFET 400, and the GAA FET 500 are referred to as metal to diffusion (MD) contacts, including metal to diffusion vias (VD) and gate vias (VG).

Vertical structure-based devices, such as the FinFET 400 and the GAA FET 500, represent a significant advance in integrated circuit (IC) technology over planar-based devices. Vertical structure-based devices are three-dimensional structures on the surface of a semiconductor substrate. A FinFET transistor (e.g., FinFET 400) is a fin-based metal oxide semiconductor field effect transistor (MOSFET). A nanowire FET also represents a significant advancement in IC technology. A gate all around (GAA) nanosheet-based device (e.g., GAA FET 500) is another three-dimensional structure on the surface of a semiconductor substrate. Other vertical structure-based devices include omega-gate devices as well as pi-gate devices. A vertical structure-based field effect transistor may be referred to as a FinFET device, a GAA nanosheet-based device, a GAA nanowire-based device, an omega-gate device, a pi-gate device, or other like FET device.

Advanced logic complementary metal oxide semiconductor (CMOS) scaling for FinFET technologies, such as GAA FETs, achieves a performance-power-area (PPA) boost over past process nodes. Unfortunately, further FinFET transistor mobility in smaller process nodes is difficult due to channel induced subthreshold leakage, which causes source/drain-to-substrate junction leakage. Therefore, a trench isolation technique for reducing channel induced subthreshold leakage is desired. According to aspects of the present disclosure, a bottom channel trench isolated GAA FET is described, for example, as shown in FIG. 6.

Figure 6:
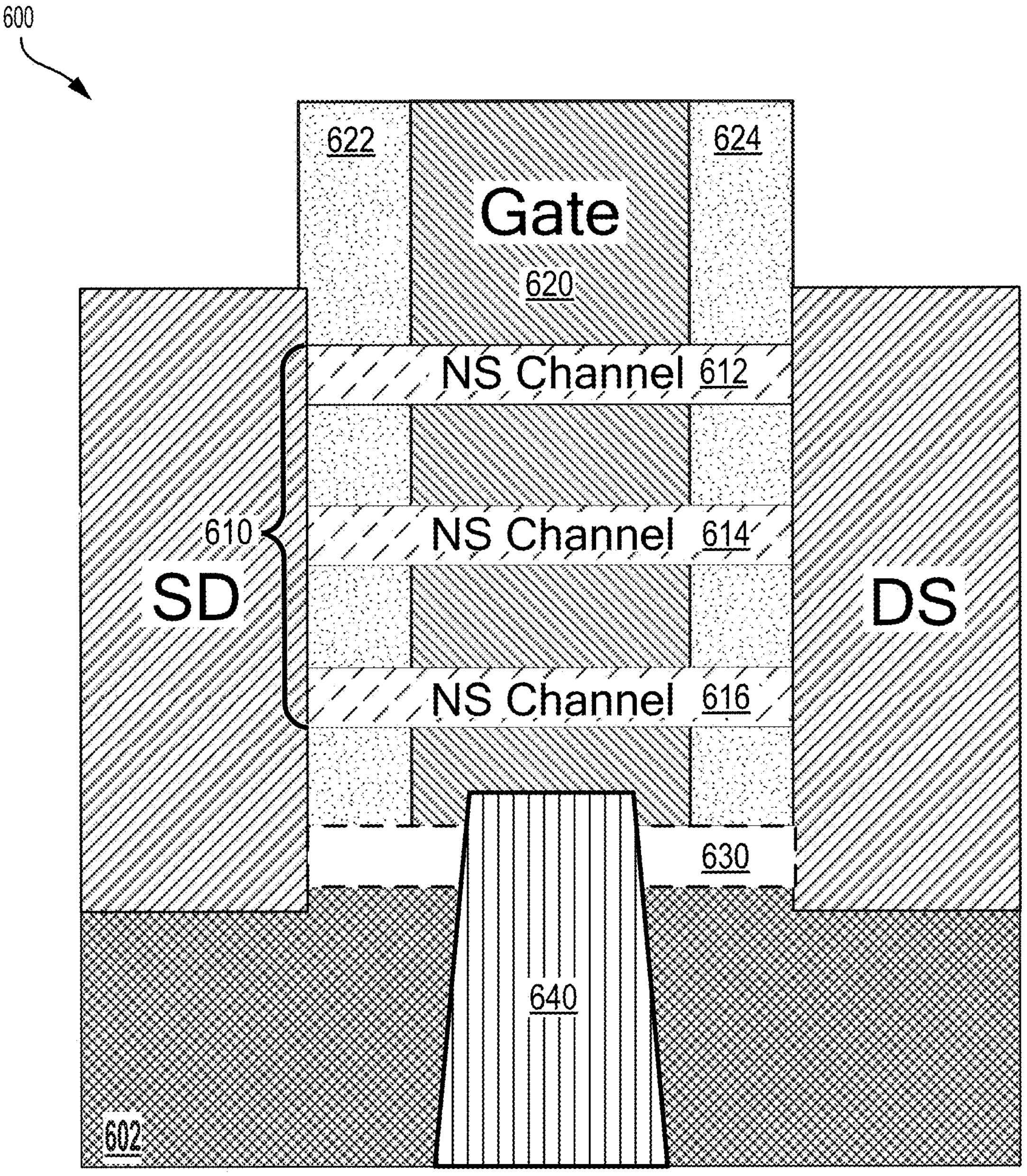
FIG. 6 is a schematic diagram illustrating a gate all around (GAA) field effect transistor (FET) (GAA FET) having a trench isolated bottom, according to various aspects of the present disclosure.

FIG. 6 is a schematic diagram illustrating a gate all around (GAA) field effect transistor (FET) (GAA FET) 600 having a trench isolated bottom, according to various aspects of the present disclosure. In this example, the GAA FET 600 includes a substrate 602, having a nanosheet structure 610 on the substrate 602. The GAA FET 600 also includes a source/drain (SD) region in the substrate 602 and coupled to a first end of the nanosheet structure 610. The GAA FET 600 further includes a drain/source (DS) region in the substrate 602 and coupled to a second end, opposite the first end of the nanosheet structure 610. Additionally, the GAA FET 600 includes a metal gate 620, having gate spacers 622, 624 on the nanosheet structure 610 to define channels 612, 614, and 616, between the SD region and the DS region. As noted, an undesired, bottom channel 630 may form below the metal gate 620 and between the SD region and the DS region, leading to channel induced subthreshold leakage, which causes higher SD-to-substrate junction leakage. In various aspects of the present disclosure, the GAA FET 600 includes a trench oxide 640 to separate the bottom channel 630, which prevents the channel induced subthreshold leakage and higher SD-to-substrate junction leakage.

In various aspects of the present disclosure, the SD and DS regions of the GAA FET 600 may be composed of silicon (Si), embedded silicon (eSi), germanium (Ge), gallium arsenide (GaAs), indium GaAs (InGaAs), gallium nitride (GaN), graphene, molybdenum disulfide ($MoS_2$), and/or phosphorus. Alternatively, the SD and DS regions of the GAA FET 600 may be composed of silicon (Si), germanium (Ge), embedded silicon germanium (eSiGe), silicon germanium (SiGe), indium antimonide (InSb), graphene, molybdenum disulfide ($MoS_2$), and/or phosphorus. In various aspects of the present disclosure, the SD region and the DS region are composed of boron-doped silicon germanium (SiGe:B) for P-type FET (PFET) devices, and phosphorus doped silicon (Si:P) for N-type FET (NFET) devices A process of fabricating the GAA FET 600 is illustrated, for example, in FIGS. 7A-7C.

Figures 7A, 7B, 7C:
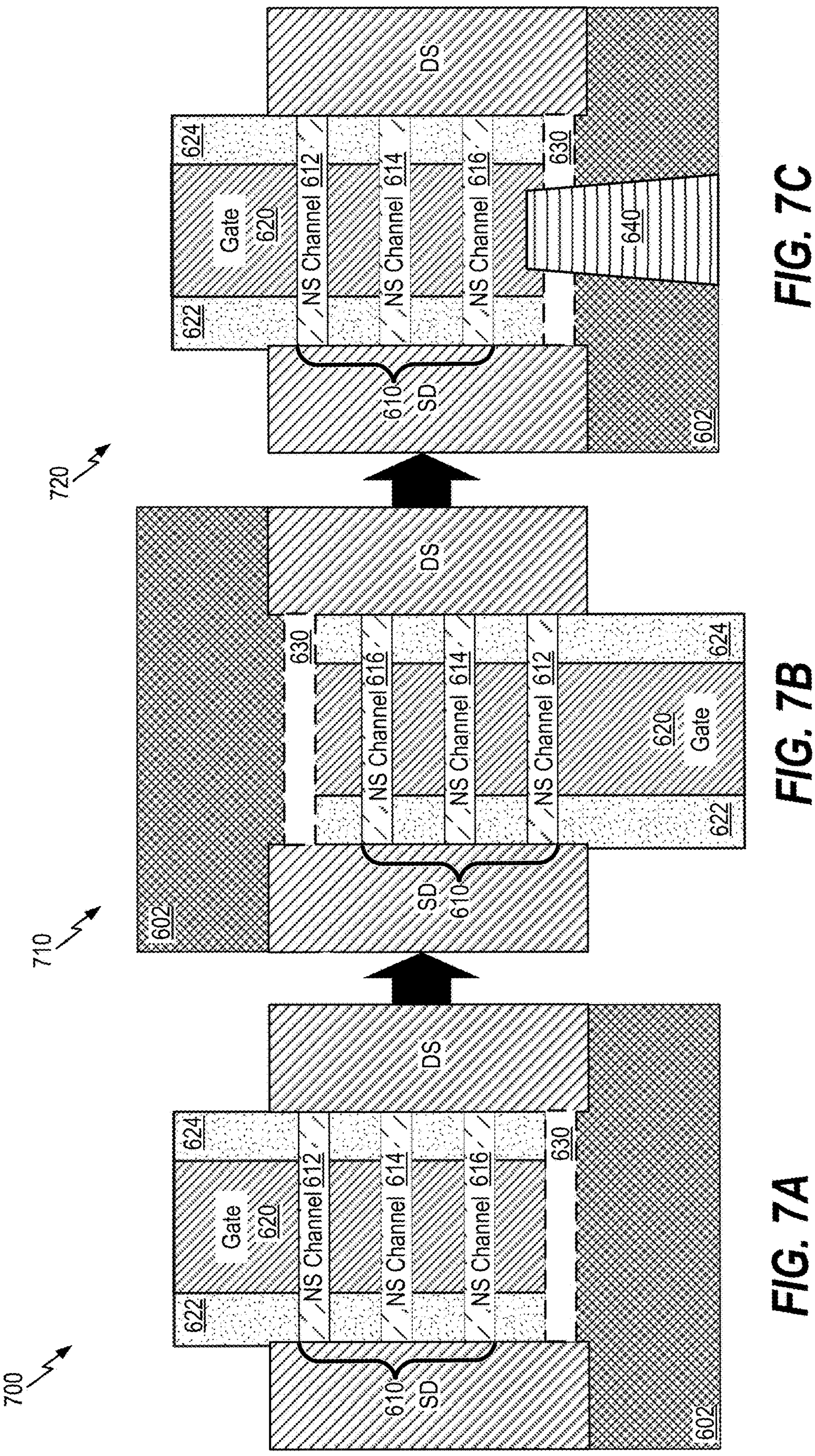
FIGS. 7A-7C are schematic diagrams illustrating a process for forming the GAA FET of FIG. 6, including the trench oxide separating a bottom channel of the GAA FET, according to various aspects of the present disclosure.

FIGS. 7A-7C are schematic diagrams illustrating a process for forming the GAA FET 600 of FIG. 6, including the trench oxide 640 separating the bottom channel 630 of the GAA FET 600, according to various aspects of the present disclosure.

FIG. 7A illustrates a first step 700 in the process of forming the GAA FET 600 of FIG. 6, including the trench oxide 640 separating the bottom channel 630 of the GAA FET 600, according to some aspects of the present disclosure. At the first step 700, multiple nanosheet layers are epitaxially grown (e.g., silicon (Si) germanium (SiGe)/Si layers) on the substrate 602 following well formation in the substrate 602.

As further illustrated in FIG. 7A, the gate spacers 622, 624 are formed on the sidewalls of a polysilicon dummy gate (not shown). Once the gate spacers 622, 624 are formed, the SD and DS regions (e.g., embedded silicon germanium (eSiGe)) are epitaxially grown on the sidewalls of the gate spacers 622, 624. Next, the metal gate 620 (e.g., tungsten (W)) using a replacement metal gate (RMG) process is formed.

FIG. 7B illustrates a second step 710 in the process of forming the GAA FET 600 of FIG. 6, including the trench oxide 640 separating the bottom channel 630 of the GAA FET 600, according to some aspects of the present disclosure. At the second step 710, the GAA FET 600 is flipped and the substrate 602 is thinned down, for example, for a backside power rail.

FIG. 7C illustrates a last step 720 in the process of forming the GAA FET 600 of FIG. 6, including the trench oxide 640 separating the bottom channel 630 of the GAA FET 600, according to some aspects of the present disclosure. At the last step 720, a trench mask is formed on an exposed surface of the substrate 602. Once formed, the exposed surface of the substrate 602 is etched through the trench mask with the metal gate 620 providing an etch step. This etch process on the exposed surface of the substrate 602 stops on the metal gate 620 to form a trench. Once the trench is formed, an oxide (e.g., silicon oxide ($SiO_2$) or silicon nitride (SiN)) is deposited on an exposed portion of the metal gate 620 to form the trench oxide 640. In various aspects of the present disclosure, the trench oxide 640 separates the bottom channel 630, which prevents the channel induced subthreshold leakage and higher SD-to-substrate junction leakage.

The process shown in FIGS. 7A-7C forms a trench-shaped bottom-channel isolation after wafer flip and substrate thinning. For example, the wafer flip and substrate thinning are baseline processes at a two (2) nanometer process node and future process node technology. In various aspects of the present disclosure, the trench oxide 640 prevents a source/drain-drain/source (SD-DS) region electrical connection through the bottom channel 630, which eliminates subthreshold leakage through the bottom channel 630. The trench oxide 640 avoids the need for a punch-thru-stop (PTS) implant for suppressing bottom-channel subthreshold leakage and provides even lower substrate-SD junction leakage than a fin-based field effect transistor (FinFET). In operation, conventional FinFETs specify a punch-thru-stop (PTS) implant dose for fin bottom subthreshold leakage suppression.

Figure 8:
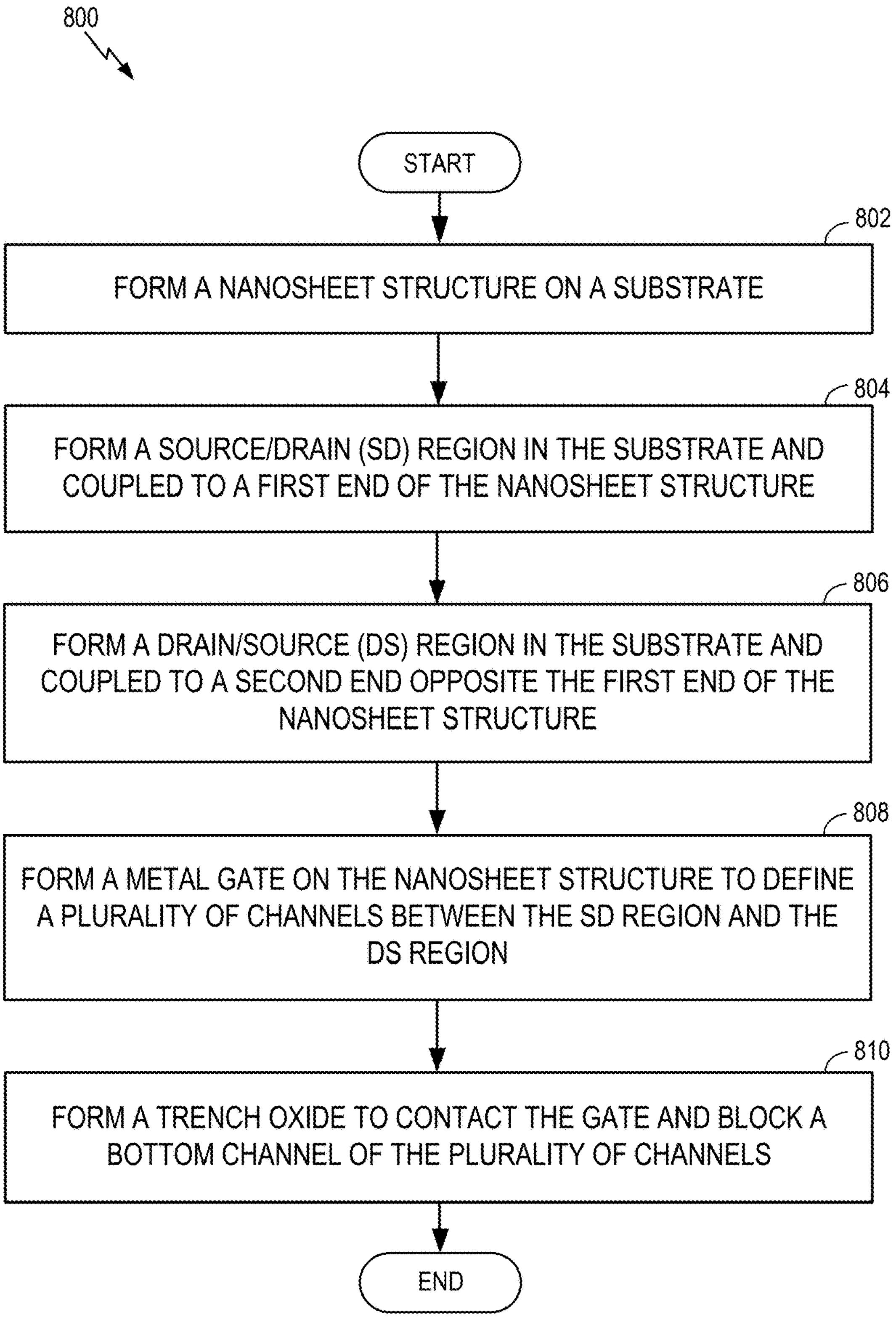
FIG. 8 is a process flow diagram illustrating a method for fabricating a gate all around (GAA) field effect transistor (FET) (GAA FET) having a trench oxide for suppressing bottom-channel subthreshold leakage, according to various aspects of the present disclosure.

FIG. 8 is a process flow diagram illustrating a method 800 for fabricating a gate all around (GAA) field effect transistor (FET) (GAA FET) having a trench oxide for suppressing bottom-channel subthreshold leakage, according to various aspects of the present disclosure. The method 800 begins at process block 802, in which a nanosheet structure is formed on a substrate. For example, as shown in FIG. 7A, the GAA FET 600 includes a substrate 602, having a nanosheet structure 610 on the substrate 602.

At process block 804, a source/drain (SD) region is formed in the substrate and coupled to a first end of the nanosheet structure. Additionally, at process block 806, a drain/source (DS) region is formed in the substrate and coupled to a second end opposite the first end of the nanosheet structure. For example, as shown in FIG. 7A, the GAA FET 600 also includes a source/drain (SD) region in the substrate 602 and coupled to a first end of the nanosheet structure 610. The GAA FET 600 further includes a drain/source (DS) region in the substrate 602 and coupled to a second end, opposite the first end of the nanosheet structure 610.

At process block 808, a metal gate is formed on the nanosheet structure to define a plurality of channels between the SD region and the DS region. Additionally, at process block 810, a trench oxide is formed to contact the gate and block a bottom channel of the plurality of channels. For example, as shown in FIGS. 7A-7C, the GAA FET 600 includes a metal gate 620, having gate spacers 622, 624 on the nanosheet structure 610 to define channels 612, 614, and 616, between the SD region and the DS region. As noted, an undesired, bottom channel 630 may form below the metal gate 620 and between the SD region and the DS region, leading to channel induced subthreshold leakage, which causes higher SD-to-substrate junction leakage. In various aspects of the present disclosure, the GAA FET 600 includes a trench oxide 640 to separate the bottom channel 630, which prevents the channel induced subthreshold leakage and higher SD-to-substrate junction leakage.

Figure 9:
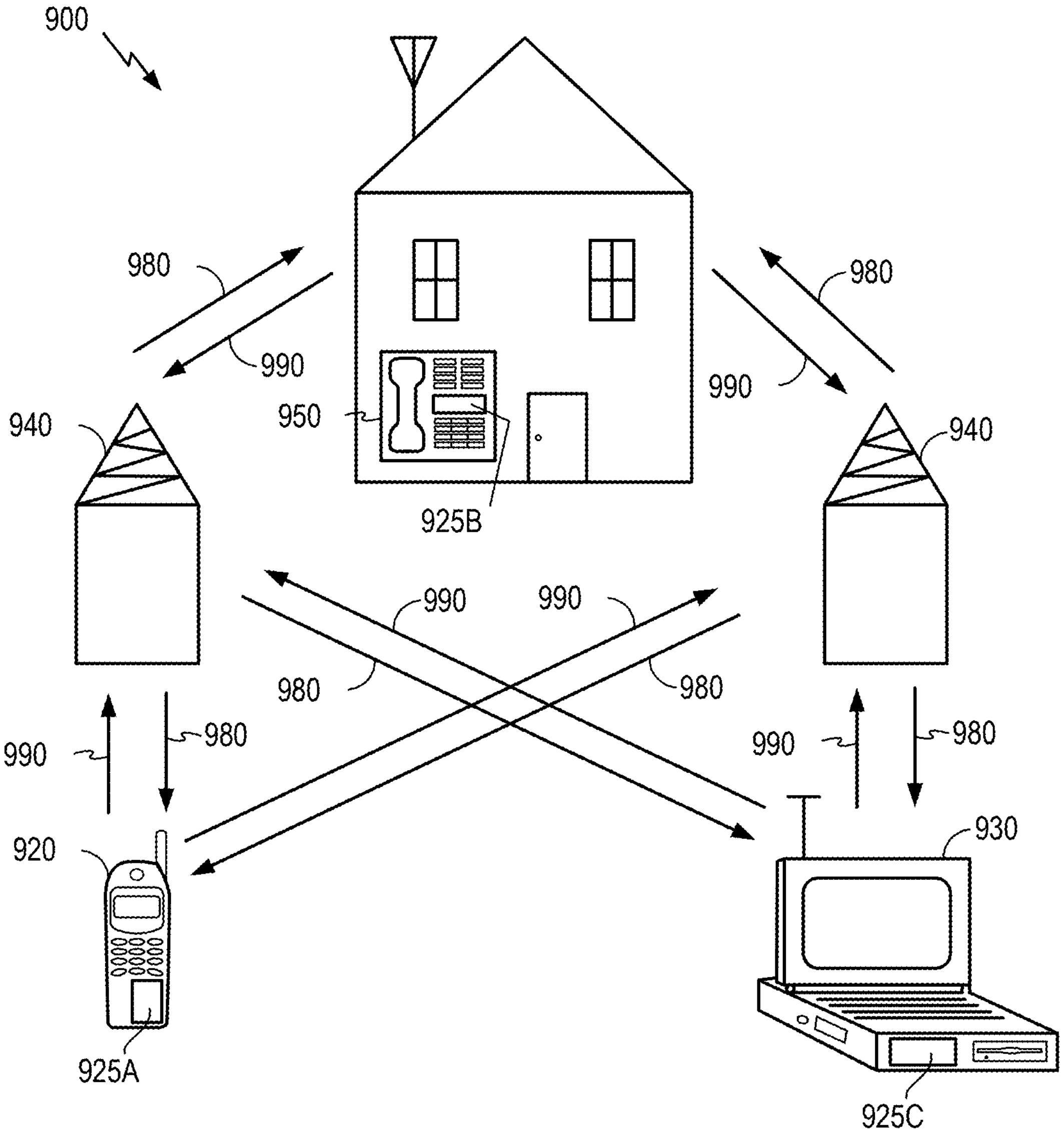
FIG. 9 is a block diagram showing an exemplary wireless communications system in which an aspect of the present disclosure may be advantageously employed.

FIG. 9 is a block diagram showing an exemplary wireless communications system 900 in which an aspect of the present disclosure may be advantageously employed. For purposes of illustration, FIG. 9 shows three remote units 920, 930, and 950, and two base stations 940. It will be recognized that wireless communications systems may have many more remote units and base stations. Remote units 920, 930, and 950 include IC devices 925A, 925C, and 925B that include the disclosed GAA FETs. It will be recognized that other devices may also include the disclosed GAA FETs, such as the base stations, switching devices, and network equipment. FIG. 9 shows forward link signals 980 from the base station 940 to the remote units 920, 930, and 950, and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as meter reading equipment, or other devices that store or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed GAA FETs.

Figure 10:
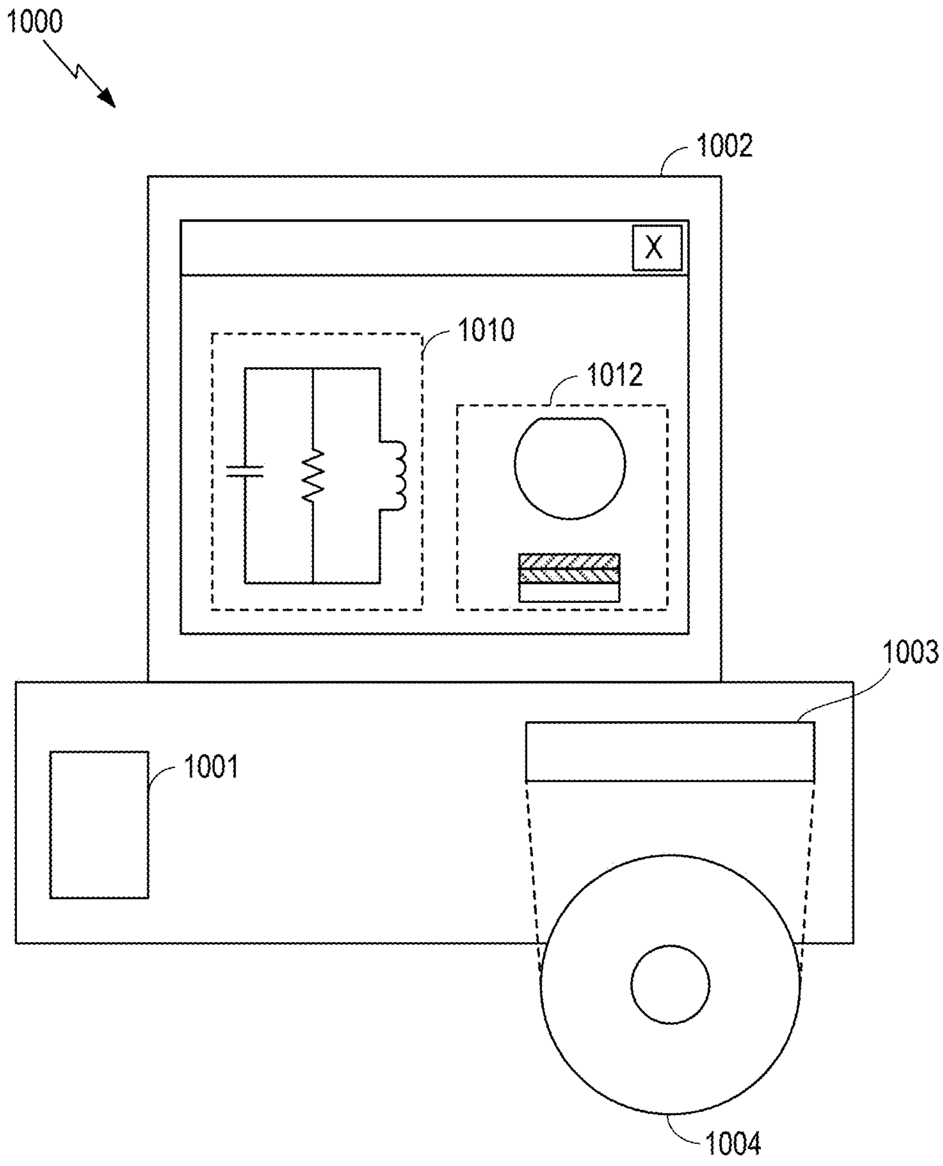
FIG. 10 is a block diagram illustrating a design workstation used for circuit, layout, and logic design of an integrated circuit (IC) structure, such as the GAA FETs disclosed above.

FIG. 10 is a block diagram illustrating a design workstation used for circuit, layout, and logic design of an integrated circuit (IC) structure, such as the GAA FETs disclosed above. A design workstation 1000 includes a hard disk 1001 containing operating system software, support files, and design software such as Cadence or OrCAD. The design workstation 1000 also includes a display 1002 to facilitate design of a circuit 1010 or a nanosheet structure 1012 including a GAA FET. A storage medium 1004 is provided for tangibly storing the design of the circuit 1010 or the nanosheet structure 1012. The design of the circuit 1010 or the nanosheet structure 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the nanosheet structure 1012 by decreasing the number of processes for designing semiconductor wafers.

Implementation examples are described in the following numbered clauses:

1. A gate all around (GAA) field effect transistor (GAA FET), comprising:
a substrate;
a nanosheet structure on the substrate;
a source/drain (SD) region in the substrate and coupled to a first end of the nanosheet structure;
a drain/source (DS) region in the substrate and coupled to a second end opposite the first end of the nanosheet structure;
a metal gate on the nanosheet structure to define a plurality of channels between the source/drain region and the drain/source region; and
a trench oxide blocking a bottom channel of the plurality of channels.

2. The GAA FET of claim 1, in which the metal gate horizontally surrounds the nanosheet structure on four sides.

3. The GAA FET of claim 1, in which the trench oxide is coupled to a portion of the metal gate.

4. The GAA FET of claim 1, in which the trench oxide extends through the substrate.

5. The GAA FET of claim 1, in which the trench oxide comprises silicon nitride (SiN).

6. The GAA FET of claim 1, in which the trench oxide comprises silicon oxide ($SiO_2$).

7. The GAA FET of claim 1, further comprising a backside power rail coupled to the substrate.

8. The GAA FET of claim 1, in which the nanosheet structure comprises silicon.

9. The GAA FET of claim 1, further comprising gate spacers between the metal gate and the SD region and the DS region.

10. The GAA FET of claim 1, in which the SD region and the DS region comprise boron-doped silicon germanium (SiGe:B) for P-type FET (PFET) devices, and phosphorus doped silicon (Si:P) for N-type FET (NFET) devices.

11. A method for fabricating a gate all around (GAA) field effect transistor (FET) (GAA FET), the method comprising:
forming a nanosheet structure on a substrate;
forming a source/drain (SD) region in the substrate and coupled to a first end of the nanosheet structure;
forming a drain/source (DS) region in the substrate and coupled to a second end opposite the first end of the nanosheet structure;
forming a metal gate on the nanosheet structure to define a plurality of channels between the SD region and the DS region; and
forming a trench oxide to contact the gate and block a bottom channel of the plurality of channels.

12. The method of clause 11, in which forming the trench oxide comprises:
forming a trench mask on an exposed surface of the substrate;
etching the exposed surface of the substrate through the trench mask and stopping on the metal gate to form a trench; and
depositing an oxide on an exposed portion of the metal gate to form the trench oxide.

13. The method of any of clauses 11 or 12, in which forming the trench oxide comprises:
flipping the GAA FET; and
thinning the substrate.
14. The method of any of clauses 11-13, in which the metal gate horizontally surrounds the nanosheet structure on four sides.
15. The method of any of clauses 11-14, in which the trench oxide comprises silicon nitride (SiN).
16. The method of any of clauses 11-14, in which the trench oxide comprises silicon oxide ($SiO_2$).
17. The method of any of clauses 11-16, further comprising a backside power rail coupled to the substrate.
18. The method of any of clauses 11-17, in which the nanosheet structure comprises silicon.
19. The method of any of clauses 11-18, further comprising gate spacers between the metal gate and the SD region and the DS region.
20. The method of any of clauses 11-19, in which the SD region and the DS region comprise boron-doped silicon germanium (SiGe:B) for P-type FET (PFET) devices, and phosphorus doped silicon (Si:P) for N-type FET (NFET) devices.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform the same function or achieve the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A gate all around (GAA) field effect transistor (GAA FET), comprising:
- a substrate;
- a nanosheet structure on the substrate;
- a source/drain (SD) region in the substrate and coupled to a first end of the nanosheet structure;
- a drain/source (DS) region in the substrate and coupled to a second end opposite the first end of the nanosheet structure;
- a metal gate on the nanosheet structure to define a plurality of channels between the source/drain region and the drain/source region; and
- a trench oxide directly coupled to a portion of the metal gate and separating a bottom channel of the plurality of channels from the substrate.

2. The GAA FET of claim 1, in which the metal gate horizontally surrounds the nanosheet structure on four sides.

3. The GAA FET of claim 1, in which the trench oxide extends through the substrate.

4. The GAA FET of claim 1, in which the trench oxide comprises silicon nitride (SiN).

5. The GAA FET of claim 1, in which the trench oxide comprises silicon oxide ($SiO_2$).

6. The GAA FET of claim 1, further comprising a backside power rail coupled to the substrate.

7. The GAA FET of claim 1, in which the nanosheet structure comprises silicon.

8. The GAA FET of claim 1, further comprising gate spacers between the metal gate and the SD region and the DS region.

9. The GAA FET of claim 1, in which the SD region and the DS region comprise boron-doped silicon germanium (SiGe:B) for P-type FET (PFET) devices, and phosphorus doped silicon (Si:P) for N-type FET (NFET) devices.

* * * * *